(12) United States Patent
Park

(10) Patent No.: US 9,998,101 B2
(45) Date of Patent: Jun. 12, 2018

(54) METHOD FOR CONTROLLING OPERATION OF MOVING AVERAGE FILTER

(71) Applicant: LSIS CO., LTD., Gyeonggi-do (KR)

(72) Inventor: Jo-Dong Park, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days. days.

(21) Appl. No.: 15/393,952

(22) Filed: Dec. 29, 2016

(65) Prior Publication Data

US 2017/0207776 A1   Jul. 20, 2017

(30) Foreign Application Priority Data

Jan. 19, 2016   (KR) .................. 10-2016-0006290

(51) Int. Cl.
  *H03K 5/1252*   (2006.01)
(52) U.S. Cl.
  CPC .................. *H03K 5/1252* (2013.01)
(58) Field of Classification Search
  CPC .................................................. H03K 5/1252
  See application file for complete search history.

(56) References Cited

U.S. PATENT DOCUMENTS 6,012,031 A    1/2000  Oliver et al.
7,129,424 B2 * 10/2006 Vilhjalmsson ....... G01G 3/1414
                                                        177/185

FOREIGN PATENT DOCUMENTS

| EP | 1 739 513 A1 | 1/2007 |
| GB | 2 248 954 A | 4/1992 |
| JP | H3-71713 A | 3/1991 |
| JP | H0419519 A | 1/1992 |
| JP | H08-52117 A | 2/1996 |
| JP | H11340933 A | 12/1999 |
| JP | 4032681 B2 | 1/2008 |
| JP | 2012085229 A | 4/2012 |
| JP | 5229081 B2 | 7/2013 |
| JP | 2013-245468 A | 12/2013 |
| JP | 2006-295462 A | 10/2016 |
| KR | 10-0628878 B1 | 9/2006 |

(Continued)

OTHER PUBLICATIONS

Search report dated Jun. 28, 2017 issued in corresponding European Application No. 16203800.4.

(Continued)

*Primary Examiner* — Jeffrey Zweizig
(74) *Attorney, Agent, or Firm* — K&L Gates LLP

(57) ABSTRACT

The present invention relates to a method for controlling the operation of a moving average filter, which is capable of optimizing the ability to cope with a surge noise through reasonable control of a tracking speed with respect to a change in an input value. The method includes: (a) a step of setting a stability reference value and a corresponding sampling interval; (b) a step of inputting measurement data; (c) a step of calculating a first moving average using the measurement data input in the step (b) by applying a basic sampling interval; and (d) a step of calculating a second moving average for the measurement data by applying the sampling interval corresponding to the stability reference value set in the step (a) if the first moving average is equal to or larger than the stability reference value.

3 Claims, 10 Drawing Sheets

(56) References Cited

FOREIGN PATENT DOCUMENTS

| KR | 10-0835682 B1 | 6/2008 |
|---|---|---|
| KR | 10-1018140 B1 | 2/2011 |
| KR | 10-1189864 B1 | 10/2012 |
| KR | 10-2013-0134128 A | 12/2013 |
| WO | 01/25731 A2 | 4/2001 |
| WO | 0125731 A2 | 4/2001 |
| WO | 2015103127 A1 | 7/2015 |

OTHER PUBLICATIONS

Japanese office action for related Japanese Application No. 2016-243596; action dated Feb. 20, 2018; (5 pages).

\* cited by examiner

METHOD FOR CONTROLLING OPERATION OF MOVING AVERAGE FILTER

CROSS REFERENCE TO RELATED APPLICATION

This application claims the benefit of Korean Patent Application No. 10-2016-0006290, filed on Jan. 19, 2016, entitled "METHOD FOR CONTROLLING OPERATION OF MOVING AVERAGE FILTER", which is hereby incorporated by reference in its entirety into this application.

BACKGROUND

1. Technical Field

The present invention relates to a method for controlling the operation of a moving average filter, which is capable of optimizing the ability to cope with a surge noise through reasonable control of a tracking speed with respect to a change in an input value.

2. Description of the Related Art

Information, which is continuously changed with time, such as sound, light, temperature, pressure, position and the like, can be converted into an analog electrical signal (voltage or current) by means of a transducer or a sensor. An electronic circuit configured to deliver the information by amplifying, detecting and converting a voltage, current, frequency or the like of the analog electrical signal obtained thus is referred to as an analog circuit.

Such an analog circuit may contain a noise. As a randomly-varying external signal, the noise is generated by random heat vibration of particles such as atoms. The noise is mainly generated due to use of poorly designed parts, repeated radiation of a signal for remote transmission, introduction of an external electric signal, etc. Such a noise may decrease a level of an original signal by decreasing a irregular change in the signal.

If a random external noise is added to an analog signal, it is difficult to distinguish from the original signal. This problem may be solved by a separate circuit or algorithm adapted to cope with such a difficulty.

A noise filter is often used to block a noise. As a kind of the noise filter, a moving average filter has a trade-off relationship between a response speed and a noise blocking performance. That is, a higher response speed of the moving average filter provides a lower noise blocking performance thereof. Therefore, in order to increase the noise blocking performance, it is necessary to decrease the response speed.

Accordingly, the present invention suggests a novel algorithm which is capable of efficiently controlling a response speed and a noise blocking performance of a moving average filter.

SUMMARY

The present invention has been made to overcome the above problems and it is an aspect of the present invention to provide a method for controlling the operation of a moving average filter, which is capable of optimizing the ability to cope with a surge noise through reasonable control of a tracking speed with respect to a change in an input value.

The present invention is not limited to the above aspect and other aspects of the present invention will be clearly understood by those skilled in the art from the following description. The above and/or other aspects and advantages of the present invention will become apparent and more readily appreciated from the following description of the embodiments, taken in conjunction with the accompanying drawings. It should be understood that the objects and advantages of the present invention can be realized by features and combinations thereof set forth in the claims.

In accordance with one aspect of the present invention, there is provided a method for controlling the operation of a moving average filter to block a noise, including: (a) a step of setting a stability reference value and a corresponding sampling interval; (b) a step of inputting measurement data; (c) a step of calculating a first moving average using the measurement data input in the step (b) by applying a basic sampling interval; and (d) a step of calculating a second moving average for the measurement data by applying the sampling interval corresponding to the stability reference value set in the step (a) if the first moving average is equal to or larger than the stability reference value.

In some embodiment, the stability reference value set in the step (a) may include two or more different reference values, and two or more different sampling intervals corresponding the tow or more different reference values are set.

In some embodiment, the stability reference value and the sampling interval set in the step (a) may be automatically set according to the filtering environments including the current noise situations.

In some embodiment, the step (d) may return to the step (c) if the second moving average is maintained below the stability reference value for more than a specified reference time.

According to the present invention, it is possible to efficiently change a response speed and a noise blocking performance of a moving average filter to cope with a change in input conditions.

In addition, according to the present invention, it is possible to provide a moving average filter capable of providing both of a high response speed and an improved noise blocking performance.

DETAILED DESCRIPTION

Figure 1:
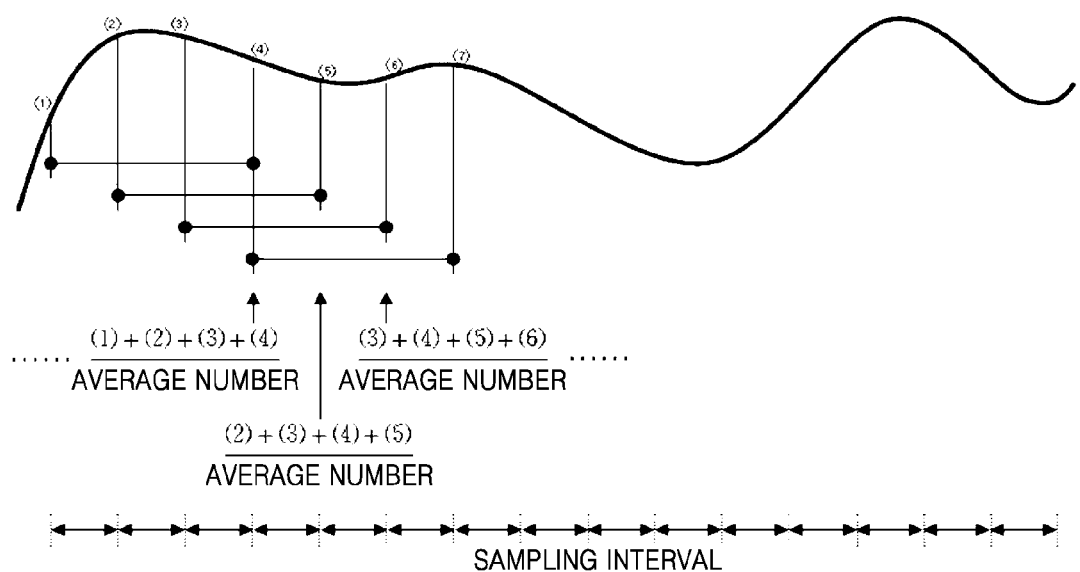
FIG. 1 is a conceptual view for explaining the meaning of a moving average and a process of calculating the moving average.

The above objects, features and advantages will become more clearly apparent from the following detailed description in conjunction with the accompanying drawings. Therefore, the technical ideas of the present invention can be easily understood and practiced by those skilled in the art. In the following detailed description of the present invention, concrete description on related functions or constructions will be omitted if it is deemed that the functions and/or constructions may unnecessarily obscure the gist of the present invention.

Hereinafter, exemplary embodiments of the present invention will be described in detail with reference to the accompanying drawings. Throughout the drawings, the same or similar elements are denoted by the same reference numerals.

FIG. 1 is a conceptual view for explaining the meaning of a moving average and a process of calculating the moving average.

A moving average means a real time average on a certain number (average number) of input values. Referring to FIG. 1, in a situation where the average number (1) is set to 4, in order to calculate the moving average, an average on recent four input values is calculated every sample point.

A moving average filter uses the calculated moving average to perform a noise filtering operation. That is, the moving average filter has an algorithm which accumulates input values by the average number (1) and outputs an average of the sum of the accumulated input values every sampling point. In other words, the moving average filter has, as an input, an AD conversion value (digital value) into which an input analog electrical signal is converted by means of an AD converter or the like, and generates an output value corresponding to the AD conversion value. Here, the average number (1) is referred to as a moving average filter value. Accordingly, in FIG. 1, the moving average filter value is 4.

The following equation 1 is a moving average calculation equation based on which the moving average filter uses the moving average filter value (1) to calculate an output value (moving average).

Input filter output value[$n$]=(AD conversion value [$n$]+AD conversion value[$n-1$]+ . . . AD conversion value[$n-1+1$])/1    [Eq. 1]

where 1 denotes the average number and n>1.

According to the moving average calculation equation expressed by the equation 1, the output value can be calculated by adding (1-1) previous input values to the current input value (the AD conversion value[n] in the equation 1) and then dividing the sum by the moving average filter value (the average number (1)).

FIGS. 2A to 3B are graphs for explaining a process of operation of a conventional moving average filter. In these graphs, a y axis represents measurement data such as a voltage, a weight or the like and an x axis represents time divided by a certain interval unit. For example, if a measurement cycle for the input data such as a voltage, a weight or the like is one second, the scale unit of the x axis may mean time of one second, which may be expressed as a 'sample period.'

Figure 2A:
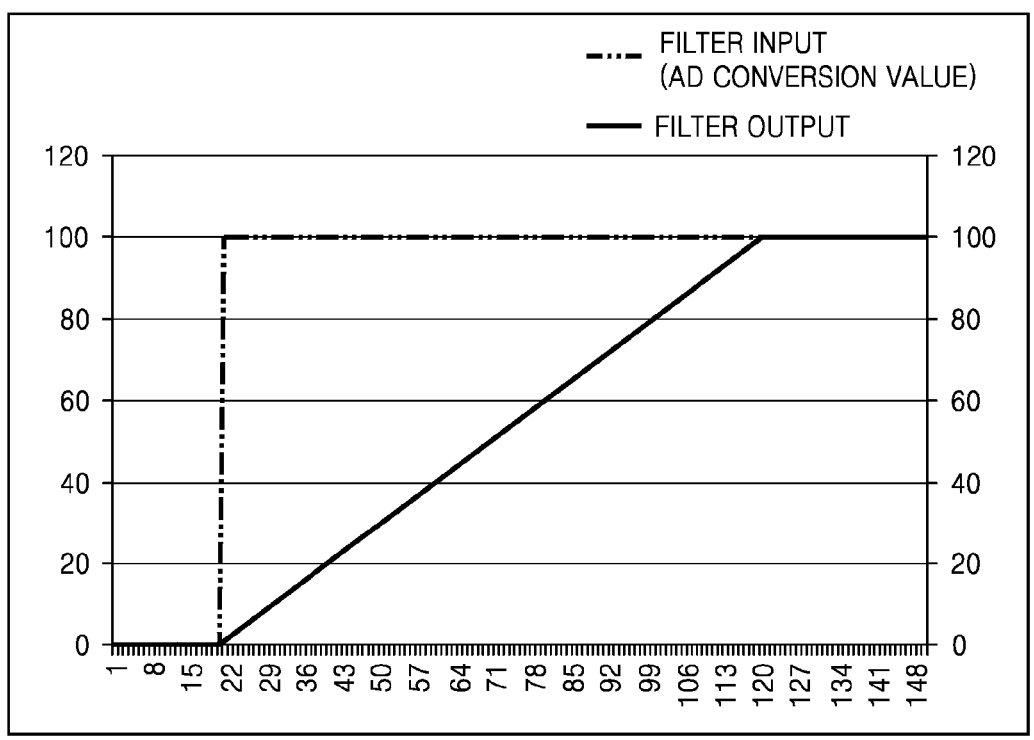
FIGS. 2A to 3B are graphs for explaining a process of operation of a conventional moving average filter.
Figure 2B:
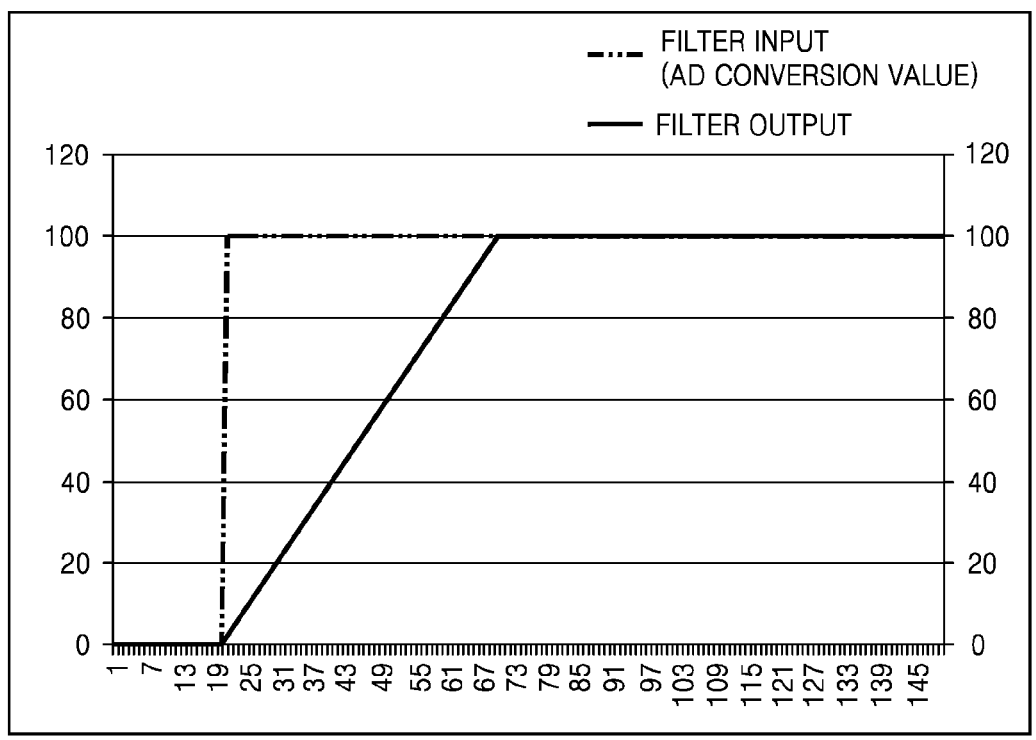
Figure 3A:
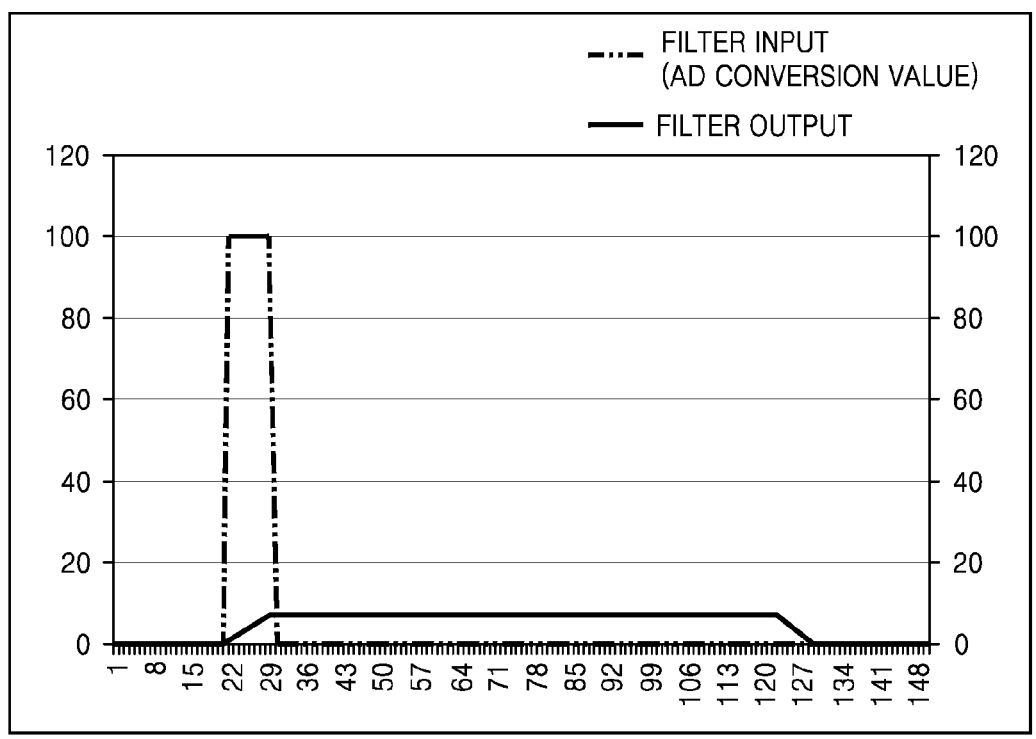
Figure 3B:
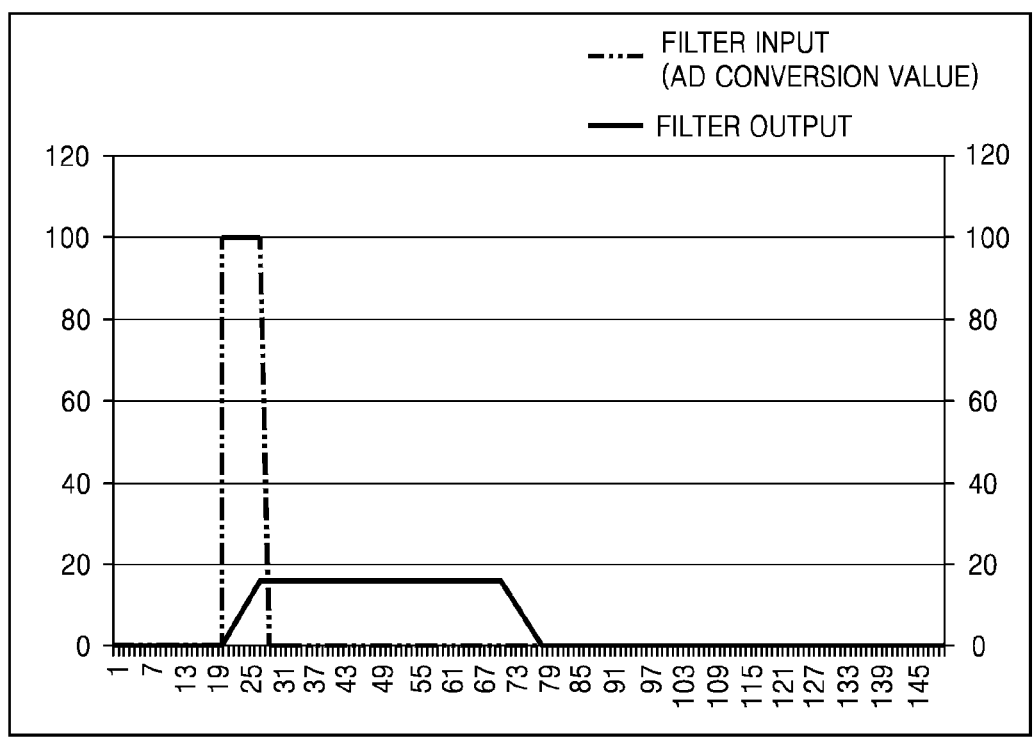

Specifically, FIGS. 2A and 2B show an output value in a case where the moving average filter value is 100 and 50 when an input value is instantaneously changed from 0 to 100, respectively, and FIGS. 3A and 3B show an output value in a case where the moving average filter value is 100 and 50 when an external electrical signal such as a surge noise is input during 8 sampling intervals, respectively.

First, referring to FIGS. 2A and 2B, when the input value is instantaneously changed from 0 to 100, a response speed (tracking speed) for this change becomes higher as the moving average filter value becomes smaller. In other words, in FIG. 2A where the moving average filter value is 100, the filter output value is 100, which is equal to the input value, nearly at a 120 sampling point, whereas, in FIG. 2B where the moving average filter value is 50, the filter output value is 100, which is equal to the input value, nearly at a 70 sampling point. That is, the response speed of the moving average filter is in inverse proportion to the moving average filter value.

Next, referring to FIGS. 3A and 3B, when a noise is input during about 8 sampling intervals, if the moving average filter value is 100 (FIG. 3a), the output value is about 8 during about 90 to 100 sampling intervals, whereas, if the moving average filter value is 50 (FIG. 3b), the output value is about 16 during about 40 to 50 sampling intervals.

In other words, when a system employing such a moving average filter determines whether or not an error for a noise or the like is allowed, on the basis of an output value of 10 (e.g., 10 v or 10 dB), in a case where the moving average filter value is 100 (FIG. 3A), there occurs no problem since the output value does not exceed 10 in any intervals. On the contrary, in a case where the moving average filter value is 50 (FIG. 3B), there may occur a problem such as system shutdown or the like since the output value is 16 in some intervals, which is out of an error range. That is, the blocking performance of the moving average filter against the surge noise or the like is in proportion to the moving average filter value.

Accordingly, since a smaller moving average filter value provides a lower noise blocking performance although it provides a higher response speed of the moving average filter, there is a difficulty in determining an appropriate moving average filter value. Accordingly, the present invention suggests a method for controlling the operation of a moving average filter, which is capable of providing both of a high response speed and a high noise blocking performance.

Figure 4:
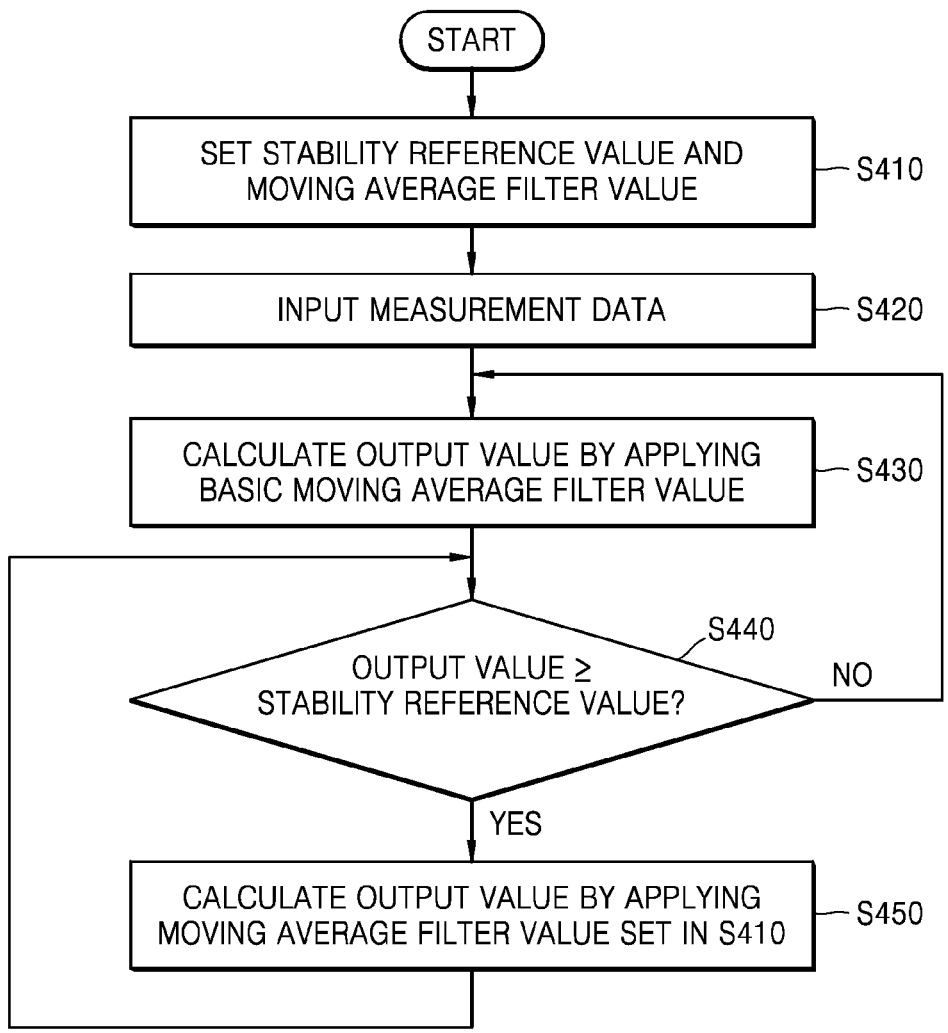
FIG. 4 is a flow chart for explaining a method for controlling the operation of a moving average filter according to one embodiment of the present invention.
Figure 5A:
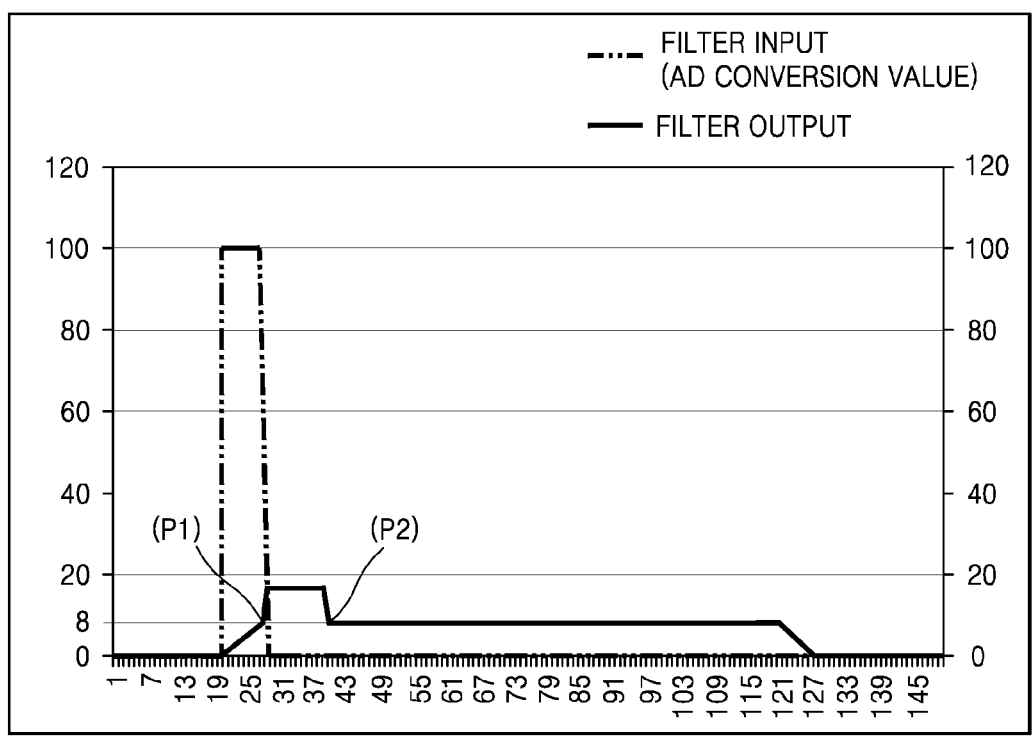
FIGS. 5A and 5B are graphs for explaining a process of operation of the moving average filter according to one embodiment of the present invention.
Figure 5B:
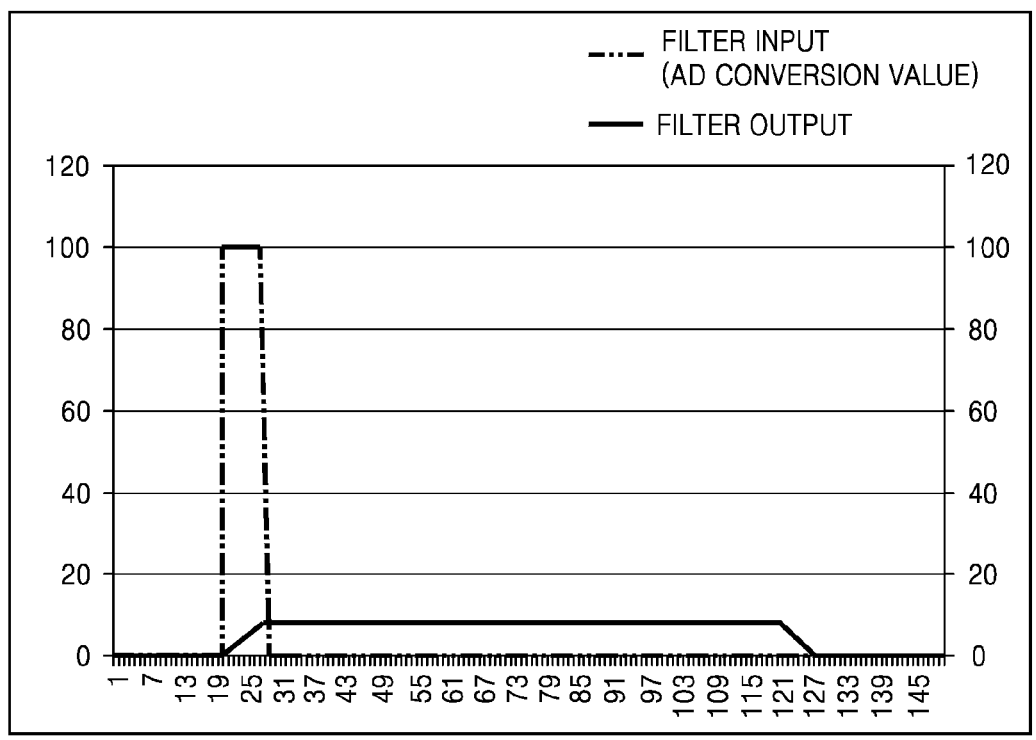

FIG. 4 is a flow chart for explaining a method for controlling the operation of a moving average filter according to one embodiment of the present invention. FIGS. 5A and 5B are graphs for explaining a process of the operation of the moving average filter shown in FIG. 4.

First, referring to FIG. 4, a method for controlling the operation of a moving average filter according to one embodiment of the present invention includes a step S410 of setting a stability reference value and a corresponding moving average filter value, a step S420 of inputting measurement data, a step S430 of calculating an output value by applying a basic moving average filter value, a step S440 of comparing the output value and the stability reference value, and a step S450 of calculating an output value by applying the moving average filter value set in the step S410 if the output value calculated in the step S430 is equal to or larger than the stability reference value.

The step S410 of setting a stability reference value and a corresponding moving average filter value is a step of adjusting a basic moving average filter value to a first moving average filter value if an output value of the moving average filter is equal to or larger than a predetermined reference value. That is, the step S410 is a step of making a setting such that the output value of the moving average filter can have a fast response to an input value by setting the moving average filter value to be smaller than a basic setting value at normal if the moving average filter outputs an output value having a variation width larger than that of an output value stabilized at normal. Accordingly, the stability reference value may be a certain reference value set in consideration of a noise allowable range according to a system design standard or the like in order to change the response speed of the moving average filter but does not mean a specific numeral or a limited range.

For example, FIG. 5A shows a stability reference value set to 8 and FIG. 5B shows a stability reference value set to 16. That is, FIG. 5A shows a case where the basic moving average filter value is 100, the stability reference value is 8 and the first moving average filter value is 50, and FIG. 5B shows a case where the basic moving average filter value is 100, the stability reference value is 16 and the first moving average filter value is 50. In each graph, a y axis represents measurement data such as a voltage, a weight or the like and an x axis represents time divided by a certain interval unit, as described earlier.

Next, in the measurement data inputting step S420, measurement data such as a voltage, a weight or the like measured by means of a separate measuring instrument is input. Thereafter, in the step S430, the moving average filter calculates an output value by applying the basic moving average filter value.

Next, in the step S440, the output value is compared with the stability reference value. As a result of the comparison, if the output value is equal to or larger than the stability reference value, in the step S450, an output value is calculated by applying the first moving average filter value. The steps S430 and S450 are repeated until data are not input any longer in the measurement data inputting step S420.

Referring to FIGS. 5A and 5B, when a surge noise is input in the measurement data inputting step S420, the moving average filter of FIG. 5A first uses a basic moving average filter value 100 to calculate an output value and then, at the moment (P1) that the output value reaches a stability reference value of 8, uses a first moving average filter value of 50 to calculate an output value. Thereafter, at the moment (P2) that the output value is again below the stability reference value of 8, the moving average filter uses the basic moving average filter value of 100 to calculate the output value.

At this time, when the output value of the moving average filter is changed to be smaller than the stability reference value of 8, it is possible to provide an additional configuration for adjusting the moving average filter value only if the output value smaller than the stability reference value is calculated continuously during a certain reference sampling interval. Here, setting of the certain reference sampling interval may be achieved by an input from a system administrator or the like or preferably automatically according to the system environments or the like.

Next, the moving average filter of FIG. 5B continues to use the basic moving average filter value of 100 to calculate an output value. That is, since the output value has not reached a stability reference value of 16, the moving average filter of FIG. 5B can calculate the output value only with the basic moving average filter value of 100 without a need to use the first moving average filter value of 50 to calculate the output value.

For example, when a system is designed to determine whether or not a noise or the like is allowed for the moving average filters of FIGS. 5A and 5B, on the basis of an output value of 10 (e.g., 10 v or 10 dB), the moving average filter of FIG. 5A shows an output value of 16 exceeding a noise allowable range during about 15 sampling intervals, whereas the moving average filter of FIG. 5B achieves appropriate noise blocking during the entire sampling intervals.

In other words, for the same input signal as those shown in FIGS. 3A and 3B, the moving average filters of FIGS. 5A and 5B can perform noise blocking equally stably or reduce an interval exceeding the noise allowable range.

In this manner, in the method for controlling the operation of the moving average filter according to the embodiment of the present invention, it is possible to determine the noise blocking performance depending on a level of setting of the stability reference value and the corresponding first moving average filter value. In addition, the stability reference value and the corresponding first moving average filter value can be set by directly inputting a specific value determined through a field test or the like from a system administrator but may be more preferably automatically set according to the system installation environments, corresponding noise situations, etc.

In this case, it is possible to provide a configuration in which the stability reference value and the corresponding first moving average filter value are changed with a change in the noise situations and the like. Further, it is possible to maintain the optimal balance state of the response speed and the noise blocking performance of the moving average filter through setting of stability reference values in additional several steps and corresponding second and third moving average filter values.

That is, although not shown in these figures, by setting another stability reference value different from the above-mentioned stability reference value and designating a second moving average filter value corresponding to the set another stability reference value, which is different from the first moving average filter value, it is possible to apply a variety of moving average filter values depending on a level of the output value of the moving average filter.

Figure 6A:
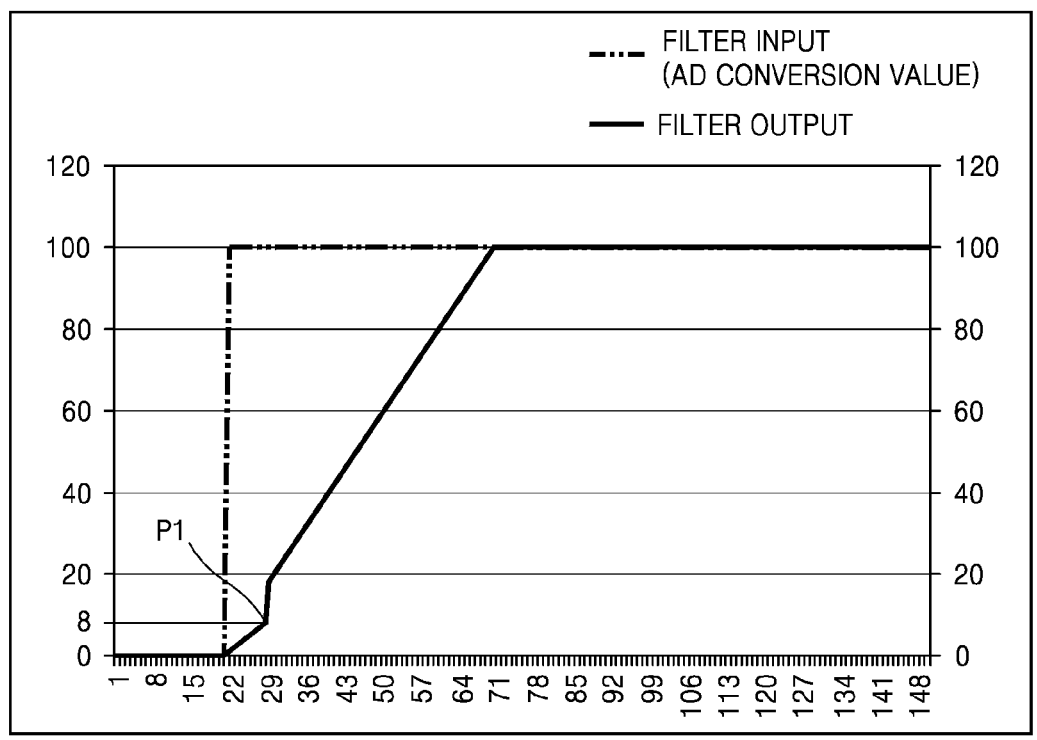
FIGS. 6A and 6B are graphs for explaining a response speed of the moving average filter to which an embodiment of the present invention is applied.
Figure 6B:
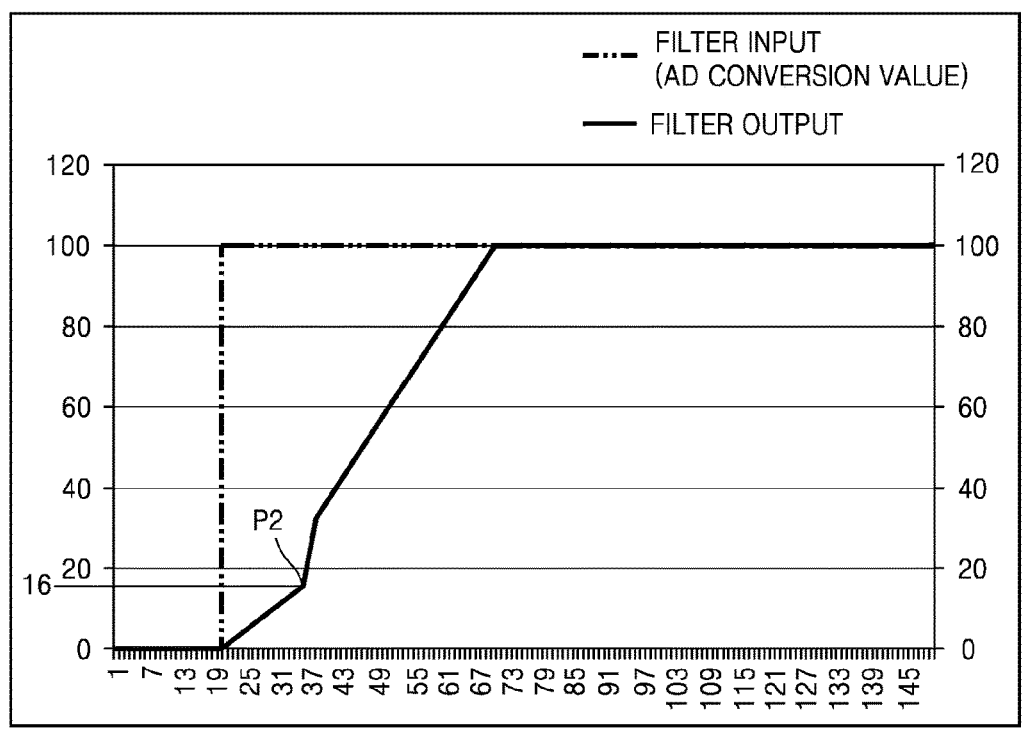

FIGS. 6A and 6B are graphs for explaining a response speed of the moving average filter to which an embodiment of the present invention is applied. Like FIG. 5A, FIG. 6A shows a case where the basic moving average filter value is 100, the stability reference value is 8 and the first moving average filter value is 50. Like FIG. 5B, and FIG. 6B shows a case where the basic moving average filter value is 100, the stability reference value is 16 and the first moving average filter value is 50.

That is, referring to FIG. 6A, at the moment (P1) that the output value of the moving average filter reaches a stability reference value of 8, the moving average filter value is changed to 50, which shows a higher response speed. Referring to FIG. 6B, at the moment (P2) that the output value of the moving average filter reaches a stability reference value of 16, the moving average filter value is changed to 50, which shows a higher response speed.

Accordingly, as can be seen from a comparison between the graphs of FIGS. 6A and 6B and the graphs of FIGS. 2A and 2B for the operation of the conventional moving average filter, the moving average filter operation controlling method of the present invention can greatly increase the response speed of the moving average filter. That is, when the moving average filter operation controlling method according to the embodiment of the present invention is applied, the response speed of the moving average filter shows a result similar to a case where the moving average filter value is small, .e., 50, and the noise blocking performance of the moving average filter shows a result similar to a case where the moving average filter value is large, .e., 100.

In other words, the present invention can provide a moving average filter which is capable of providing both of a high response speed and an improved noise blocking performance.

While the present invention has been particularly shown and described with reference to exemplary embodiments thereof, it will be understood by those skilled in the art that various changes in form and details may be made therein without departing from the spirit and scope of the present invention. The exemplary embodiments are provided for the purpose of illustrating the invention, not in a limitative sense. Thus, it is intended that the present invention covers the modifications and variations of this invention provided they come within the scope of the appended claims and their equivalents.

What is claimed is:

1. A method for controlling an operation of a moving average filter to block a noise, comprising:
   (a) a step of setting a stability reference value and a corresponding sampling interval;
   (b) a step of inputting measurement data;
   (c) a step of calculating a first moving average using the measurement data input in the step (b) by applying a basic sampling interval; and
   (d) a step of calculating a second moving average for the measurement data by applying the sampling interval corresponding to the stability reference value set in the step (a) if the first moving average is equal to or larger than the stability reference value,
   wherein the step (d) returns to the step (c) if the second moving average is maintained below the stability reference value for more than a specified reference time.

2. The method according to claim 1, wherein the stability reference value set in the step (a) includes two or more different reference values, and two or more different sampling intervals corresponding the two or more different reference values are set.

3. The method according to claim 1, wherein the stability reference value and the sampling interval set in the step (a) are automatically set according to filtering environments including current noise situations.

* * * * *